(12) United States Patent
Wilcox et al.

(10) Patent No.: US 9,992,909 B2
(45) Date of Patent: Jun. 5, 2018

(54) REVERSIBLE LOUVER FOR FABRIC CARD FAN SOLUTION

(71) Applicant: Arista Networks, Inc., Santa Clara, CA (US)

(72) Inventors: Robert Wilcox, Santa Clara, CA (US); Richard Hibbs, Santa Clara, CA (US); Leonel de los Reyes, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 579 days.

(21) Appl. No.: 14/485,114

(22) Filed: Sep. 12, 2014

(65) Prior Publication Data
US 2016/0081223 A1    Mar. 17, 2016

(51) Int. Cl.
| | | |
|---|---|---|
| H05K 5/00 | (2006.01) | |
| H05K 7/20 | (2006.01) | |
| F24F 13/14 | (2006.01) | |
| F24F 7/007 | (2006.01) | |

(52) U.S. Cl.
CPC ......... *H05K 7/20181* (2013.01); *F24F 7/007* (2013.01); *F24F 13/1413* (2013.01); *H05K 7/20172* (2013.01)

(58) Field of Classification Search
CPC . H05K 7/20181; H05K 7/20172; F24F 7/007; F24F 13/1413

USPC ....... 454/184, 359; 361/695, 679.48, 679.46, 361/679.51, 690
See application file for complete search history.

(56) References Cited

U.S. PATENT DOCUMENTS

| | | | | |
|---|---|---|---|---|
| 6,031,717 A | * | 2/2000 | Baddour | G06F 1/20 361/679.48 |
| 6,186,889 B1 | * | 2/2001 | Byrne | G06F 1/20 361/695 |
| 6,603,661 B2 | * | 8/2003 | Smith | G06F 1/183 165/80.3 |
| 7,259,962 B2 | * | 8/2007 | Chen | G06F 1/20 361/695 |

* cited by examiner

*Primary Examiner* — Vivek Shirsat
(74) *Attorney, Agent, or Firm* — Chamberlain Hrdlicka

(57) ABSTRACT

A system may include a fan module and a louver. The fan module includes a first housing, adapted to include a fan in a first orientation. The fan is adapted to cause air to flow into the rear side of the first housing and out of the front side of the first housing. The fan module also includes a key receptacle that is adapted to mate with a first key. The louver includes a second housing that includes a set of slats adapted as a one way valve. The second housing also includes the first key which is adapted to only mate with the key receptacle. The second housing also includes the second key which is adapted to not mate with the key receptacle.

11 Claims, 21 Drawing Sheets

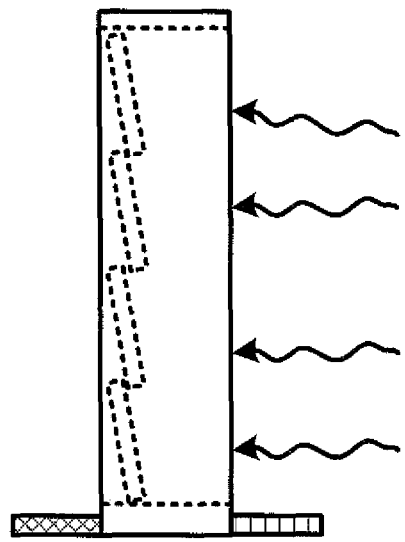
FIG. 4A
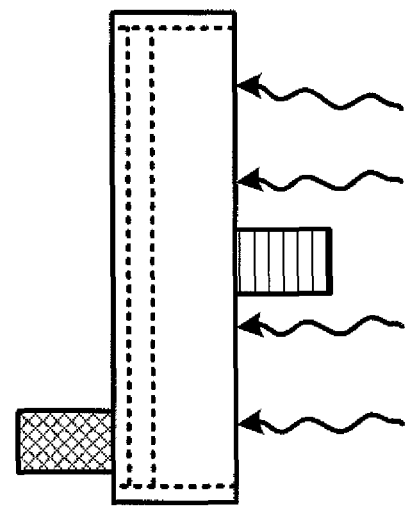
FIG. 4B
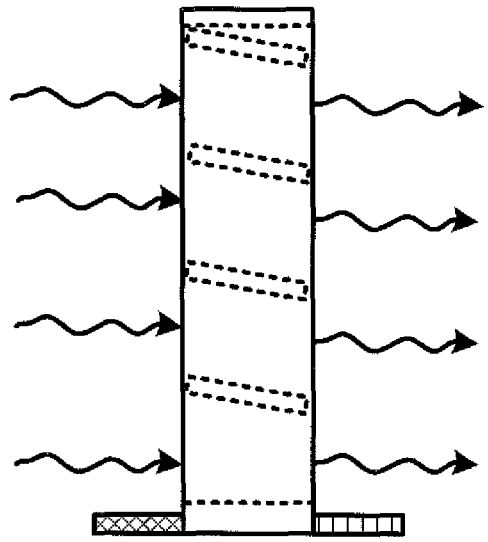
FIG. 4C
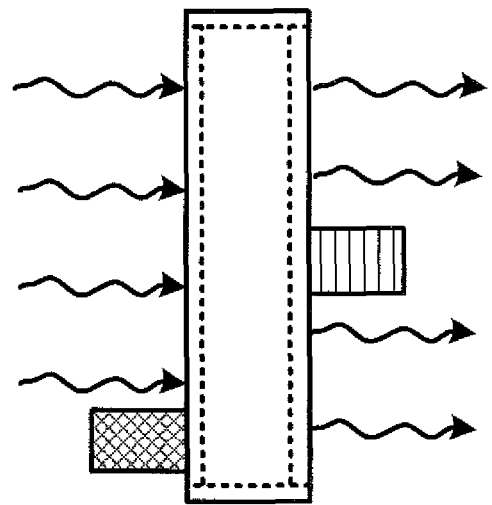
FIG. 4D
FIG. 4

REVERSIBLE LOUVER FOR FABRIC CARD FAN SOLUTION

BACKGROUND

Electronic components generate heat when operating. In some cases, the amount of heat generated is sufficient to increase the temperature in the local environment around the electronic components. In some cases, electronic components are enclosed in a chassis. Ventilation around electronic components may be used to control the temperature of the local environment around components. For example, fans within a chassis are used to draw air into the chassis from the surrounding environment and exhaust air from within to chassis into the surrounding environment.

In some cases the direction of air flow within a chassis may be directed based on the external environment around the chassis. For example, the environment around a chassis may be cooler on one side and warmer on another side. To control the local environment within the chassis, it may be desirable to draw cool air from the first side of the chassis into the chassis and exhaust air from within the chassis out of the second side of the chassis.

SUMMARY

In one aspect, a system according to one or more embodiments may include a fan module that includes a first housing, adapted to include a fan in a first orientation, that has a front side and a rear side on opposite sides of the first housing. The fan, disposed within the first housing, is adapted to cause air to flow into the rear side of the first housing, through the first housing, and out of the front side of the first housing when in the first orientation. The fan module also includes a key receptacle, disposed on the front side of the first housing, that is adapted to mate with a first key when the fan is in the first orientation. The system also includes a louver that includes a second housing that has a front side and a rear side on opposite sides of the second housing. The second housing includes a set of slats that are disposed within the second housing and are adapted as a one way valve that allows air to flow into the rear side of the second housing, through the second housing, and out of the front side of the second housing. The second housing also includes the first key, disposed on the rear side of the second housing, which is adapted to only mate with the key receptacle. The second housing also includes the second key, disposed on the front side of the second housing, which is adapted to not mate with the key receptacle. When the first key is mated with the key receptacle, a first contact is formed between the front side of the first housing and rear side of the second housing and the first contact causes, when the fan is active, an air flow into the rear side of the first housing, through the first housing, out of the front side of the first housing, into the rear side of the second housing, through the second housing, and out of the front side of the second housing.

In one aspect, a louver according to one or more embodiments may include a housing that includes a set of slats, disposed within the housing. The set of slats is adapted as a one way valve that only allows air to flow from an upstream side of the housing to a downstream side of the housing. The upstream side includes a first key adapted to mate with a first air flow component that includes a first key receptacle and the downstream side further includes a second key adapted to mate with a second air flow component that includes a second key receptacle.

In one aspect, a method of changing an air flow direction in a chassis according to one or more embodiments may include removing, from the chassis, an existing fan module that includes a first fan in a first orientation and a first key receptacle that was mated to a first key before removing the existing fan module. The first key receptacle is disposed on an exposed first side of a louver. The method further includes obtaining a new fan module that includes a second fan in a second orientation and a second key receptacle. The method further includes removing, from the chassis, the louver; reversing the orientation of the louver to expose a second side of the louver comprising a second key; placing the louver in the chassis; and placing the new fan module in the chassis and mating the second key with the second key receptacle.

Other aspects of the disclosure will be apparent from the following description and the appended claims.

BRIEF DESCRIPTION OF DRAWINGS

Certain embodiments of the disclosure will hereafter be described with reference to the accompanying drawings. It should be understood, however, that the accompanying drawings illustrate the various implementations described herein and are not meant to limit the scope of various technologies described herein. The drawings show and describe various embodiments of the current disclosure.

FIGS. 4(A)-(D) shows a louver in accordance with one or more embodiments of the invention.

DETAILED DESCRIPTION

Figure 1A:
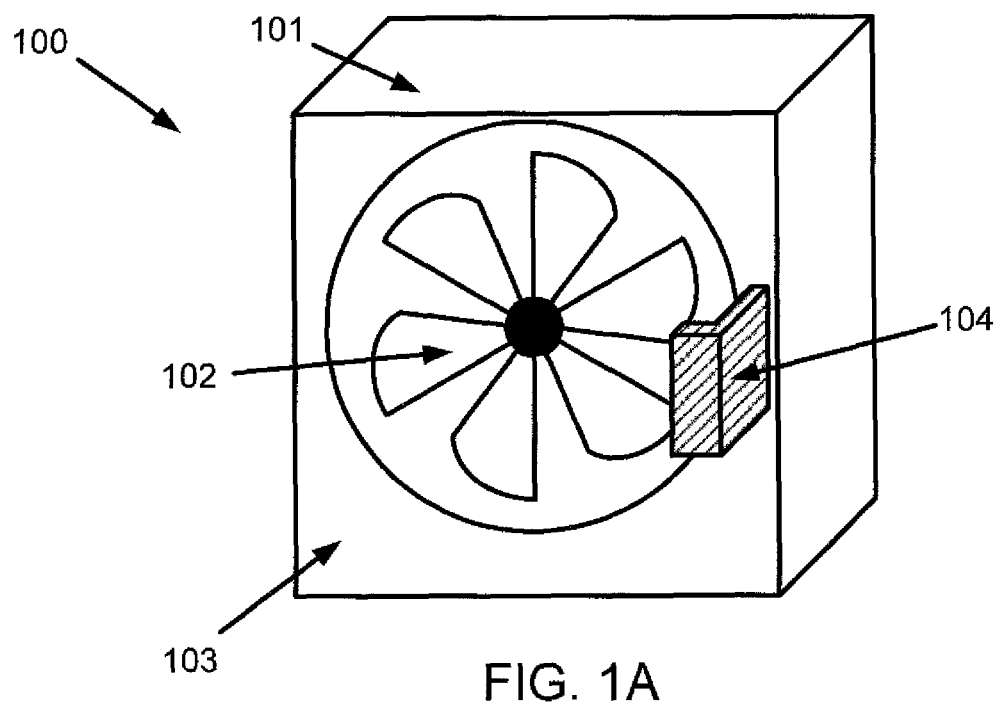
FIGS. 1(A)-(D) shows a fan module in accordance with one or more embodiments of the invention.
Figure 1B:
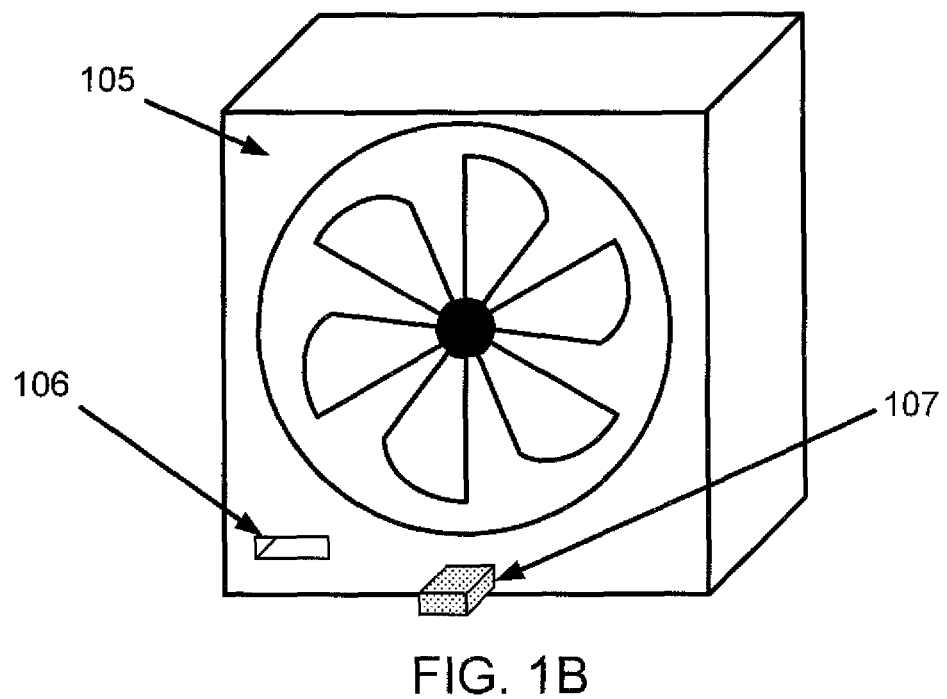

Specific embodiments will now be described in detail with reference to the accompanying figures. Numerous details are set forth to provide an understanding of the present disclosure. However, it will be understood by those skilled in the art that the embodiments of the present disclosure may be practiced without these details and that numerous variations or modifications from the described embodiments may be possible.

In the specification and appended claims: the terms "connect," "connection," "connected," "in connection with," and "connecting" are used to mean "in direct connection with" or "in connection with via one or more elements;" and the term "set" is used to mean "one element" or "more than one element." Further, the terms "couple," "coupling," "coupled," "coupled together," and "coupled with" are used to mean "directly coupled together" or "coupled together via one or more elements." As used herein, the terms "up" and "down," "upper" and "lower," "upwardly" and "downwardly," "upstream" and "downstream;" "above" and "below;" and other like terms indicating relative positions above or below a given point or element are used in this description to more clearly describe some embodiments of the disclosure.

In one or more embodiments, a fan module is used in conjunction with a louver to control air flow within a chassis. Air flow within the chassis may regulate the environment of electronic components contained within the chassis. For example, the air flow within the chassis may regulate the temperature of an electronic component such as a processor, signal processing unit, printed circuit board, power supply, memory, or any other type of electronic component. In one or more embodiments, the chassis may include two openings in the exterior walls of the chassis. When the fan module and the louver are placed near a first opening in the chassis, air is drawn into the chassis, circulated through the chassis, and exhausted out of the second opening in the chassis.

In one or more embodiments of the invention, the chassis may be located in a high density computing environment such as a data center that includes climate controlled lanes. Each climate controlled lane provides cool air or receives hot air. The environment within the chassis may be regulated by drawing cool air into the chassis and exhausting hot air out of the chassis by placing the first opening in the chassis in the first lane, the second opening in the chassis in the second lane, and activating a fan module.

In one or more embodiments of the invention, the louver acts as a one-way valve to control air flow within the chassis. The louver only allows air to flow from upstream of the louver to downstream from the louver. When the fan module within the chassis is active, an air flow is created that is directed from upstream of the louver to downstream of the louver. The air flow causes the louver to open and allows cool air, from a first climate controlled lane, to flow into the chassis and hot air to flow out of the chassis. Conversely, when the fan module within the chassis is not active, if an ambient air flow exists that is directed from downstream of the louver to upstream of the louver, the louver closes. By closing, the louver prevents hot air, from a second climate controlled lane, from flowing into the chassis and cool air from flowing out of the chassis.

In one or more embodiments of the invention, there are two types of fan modules. The first type of fan module is designed to be used upstream of the louver, e.g. the first type fan module is designed to push air into the louver to cause the louver to open. The second type of fan module is designed to be used downstream of the louver, e.g. the second type fan module is designed to draw air out of the louver to cause the louver to open.

In one or more embodiments of the invention, louvers and fan modules include portions that ensure first type fan modules are only used upstream of louvers and second type fan modules are only used downstream of louvers. In one or more embodiments of the invention, louvers include two portions formed as a first key on the downstream side of the louver and a second key on the upstream side of the louver. In one or more embodiments of the invention, each fan module includes a portion formed as a first key receptacle that only mates with a first key or the portion is formed as a second key receptacle that only mates with a second key. The set of two keys on the louver and a key receptacle on the fan module prevents first type fan modules from being inadvertently used downstream of louvers and second type fan modules from being used upstream of louvers.

In one or more embodiments of the invention, each fan module is marked to identify the fan module as a first type fan module or a second type fan module. In one or more embodiments of the invention, each side of the louver is marked to identify the side as either an upstream side or a downstream side. The markings on the fan modules and louvers may enable the mating arrangement of each fan module and louver to be readily identified.

Further, embodiments of the invention may take the form of methods of changing the direction of air flow with a chassis. The method may include removing an existing fan module from a chassis, removing a louver from a chassis, reversing the orientation of the louver, placing the louver back in the chassis, and placing a second fan module in the chassis.

In accordance with one or more embodiments of the invention, FIG. 1 shows a first fan module (100) that is to be used upstream of a louver. Specifically, FIG. 1(A) shows a front view of the first fan module (100) and FIG. 1(B) shows a rear view of the first fan module (100). The first fan module (100) includes a first housing (101). In one or more embodiments of the invention, the first housing (101) is metal, plastic, or any other structural material. The first fan module (100) further includes a first fan (102) disposed within the first housing (101). The first fan (102) is in a first orientation that causes air to flow into a rear side (103) of the first housing (101), through the first housing (101), and out of a front side (105) of the first housing (102). The first fan module (100) further includes a first portion (104), disposed on the rear side (103), formed as a handle. The first portion (104) includes markings to indicate the type of the first fan module (100), e.g. a fan module to be used upstream of a louver. In accordance with one or more embodiments of the invention, the markings are a coloring of the first portion, e.g. the first portion (104) may be substantially red in color to indicate the first fan module (100) is a first type fan module. Other colors may be used without departing from the invention.

In one or more embodiments of the invention, the first fan module (100) further includes a first key receptacle (106) disposed on the front side (105). The first key receptacle (106) is designed to only mate with a first key. In one or more embodiments, the location of the first key receptacle (106) on the front side (105) only allows the first key receptacle (106) to mate with the first key. In one or more embodiments, the shape and/or size of the first key receptacle (106) only allows the first key receptacle (106) to mate with the first key. In one or more embodiments of the invention, the first fan module (100) further includes a first power connector (107) disposed on the front side (105).

Figure 1C:
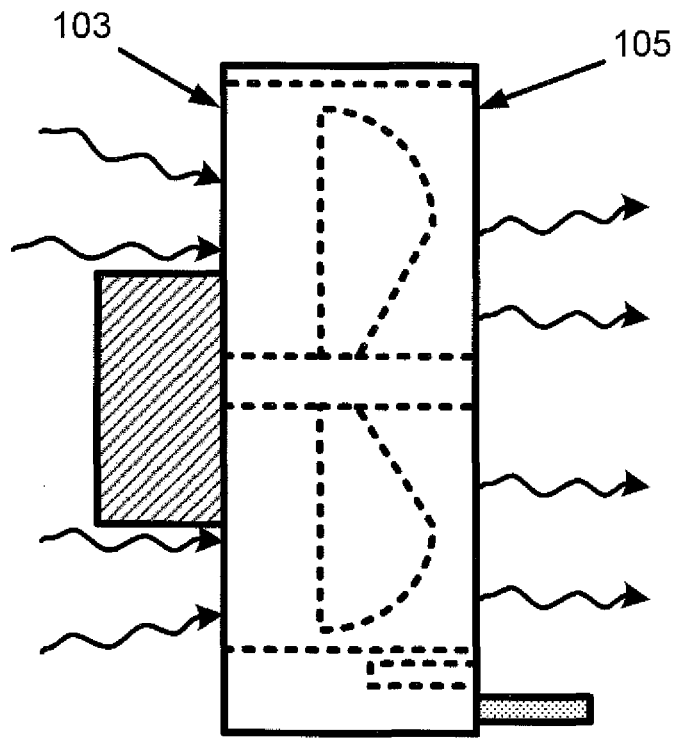
Figure 1D:
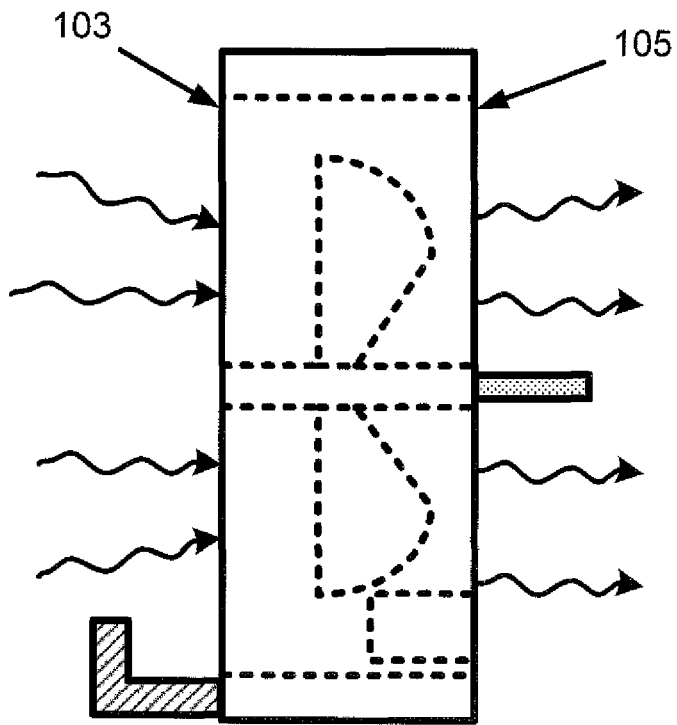

In accordance with one or more embodiments of the invention, FIG. 1(C) shows a side view of the first fan module (100) and FIG. 1(D) shows a top view of the first fan module (100). Features within the first fan module (100) are indicated by dashed lines. The direction of air flow, when the first fan (102) is active, is indicated by arrows with wavy tails. Specifically, air flows into the rear side (103), through the first fan module (100), and out of the front side (105).

In accordance with one or more embodiments of the invention, FIG. 2 shows a second fan module (200) that is to be used downstream of a louver. Specifically, FIG. 2(A) shows a front view of the second fan module (200) and FIG. 2(B) shows a rear view of the second fan module (200). The second fan module (200) includes a second housing (201). In one or more embodiments of the invention, the second housing (201) is metal, plastic, or any other structural material. The second fan module (200) further includes a second fan (202) disposed within the second housing (201). The second fan (202) is in a second orientation that causes air to flow into a front side (203) of the second housing (201), through the second housing (201), and out of a rear side (205) of the second housing (202). The second fan module (200) further includes a second portion (204), disposed on the rear side (203), formed as a handle. The second portion (204) includes markings to indicate the type of the second fan module (200), e.g. a fan module to be used downstream of a louver. In accordance with one or more embodiments of the invention, the markings are a coloring of the second portion (204), e.g. the second portion (204) may be substantially blue in color to indicate that the second fan module (200) is a second type fan module. Other colors may be used without departing from the invention.

In one or more embodiments of the invention, the second fan module (200) further includes a second key receptacle (206) disposed on the front side (205). The second key receptacle (206) is designed to only mate with a second key. In one or more embodiments, the location of the second key receptacle (206) on the front side (205) only allows the second key receptacle (206) to mate with the second key. In one or more embodiments, the shape and/or size of the second key receptacle (206) only allows the second key receptacle (206) to mate with the second key. In one or more embodiments of the invention, the second fan module (200) further includes a first power connector (207) disposed on the front side (205).

Figure 2A:
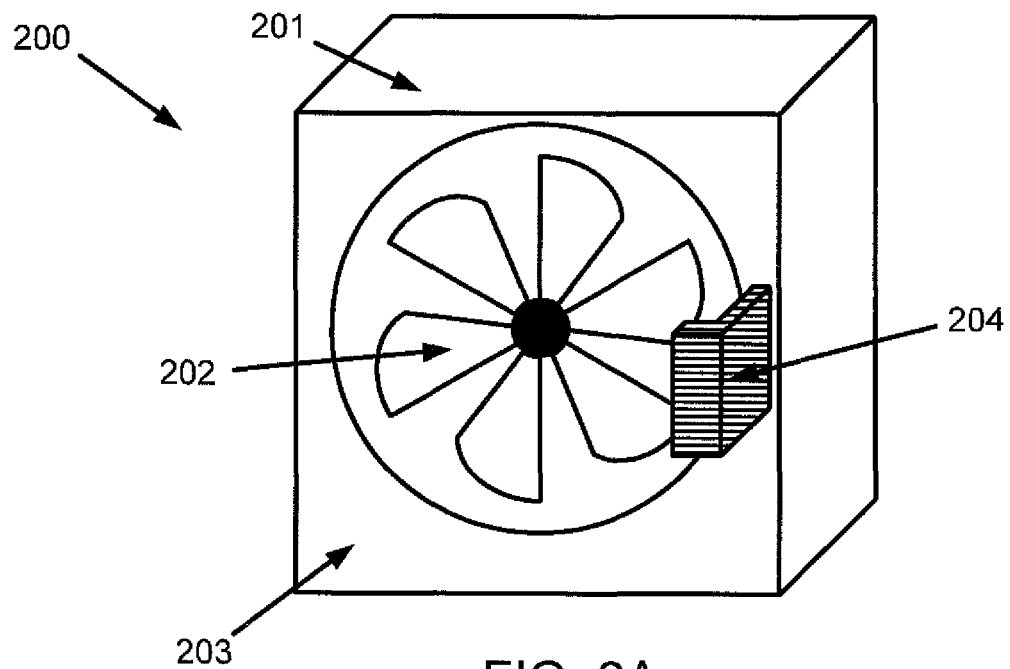
FIGS. 2(A)-(D) shows a fan module in accordance with one or more embodiments of the invention.
Figure 2B:
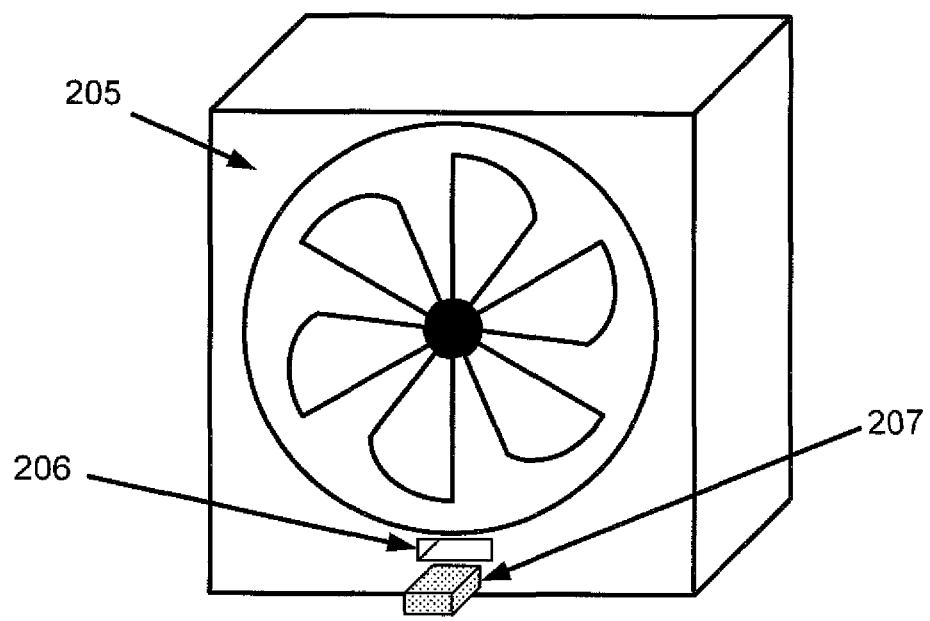
Figure 2C:
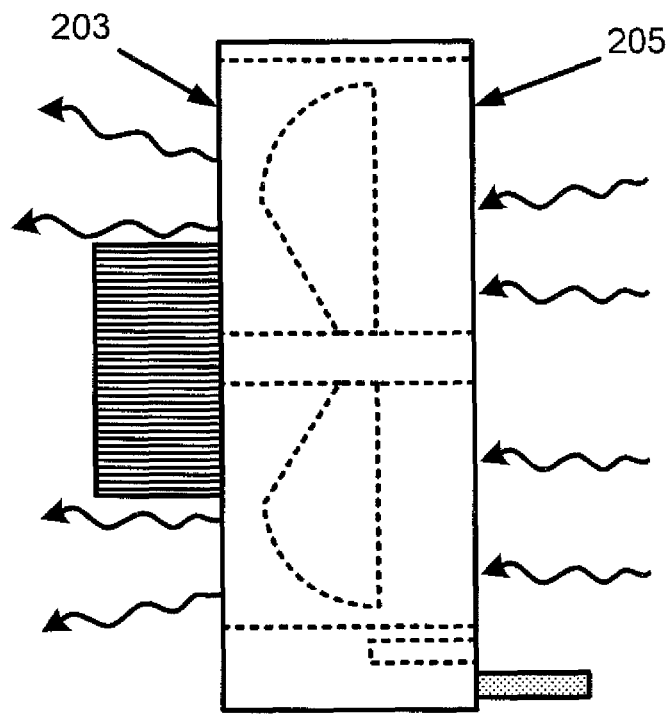
Figure 2D:
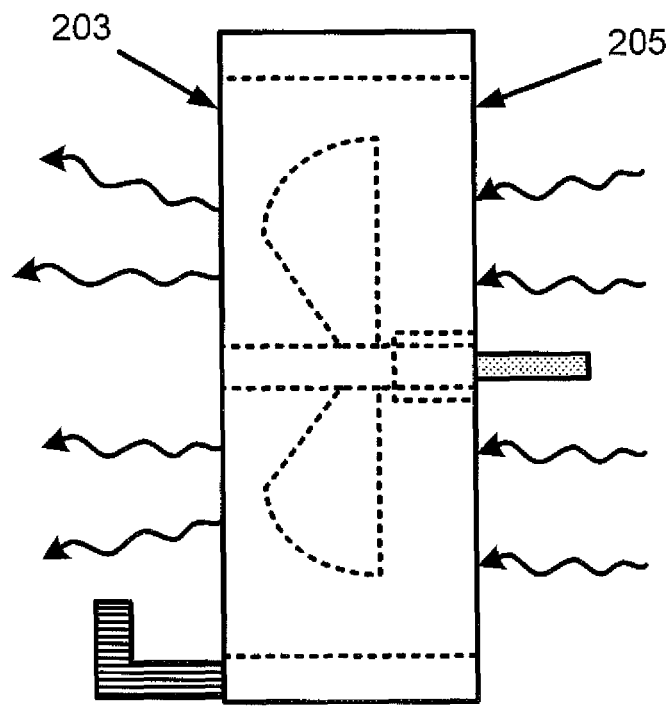
Figure 3A:
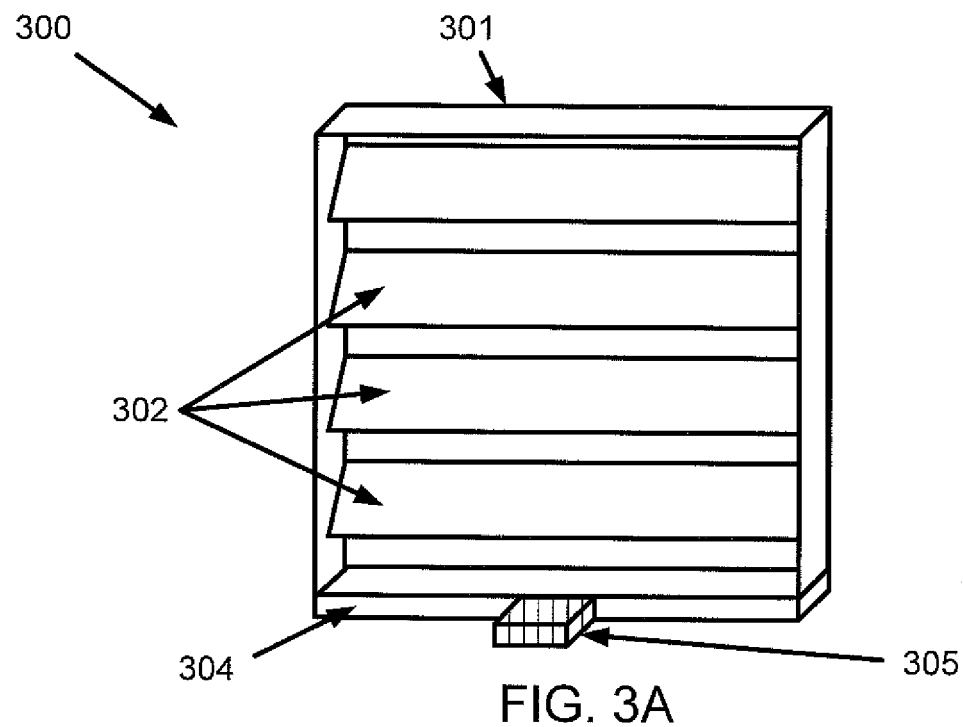
FIGS. 3(A)-(D) shows a louver in accordance with one or more embodiments of the invention.
Figure 3B:
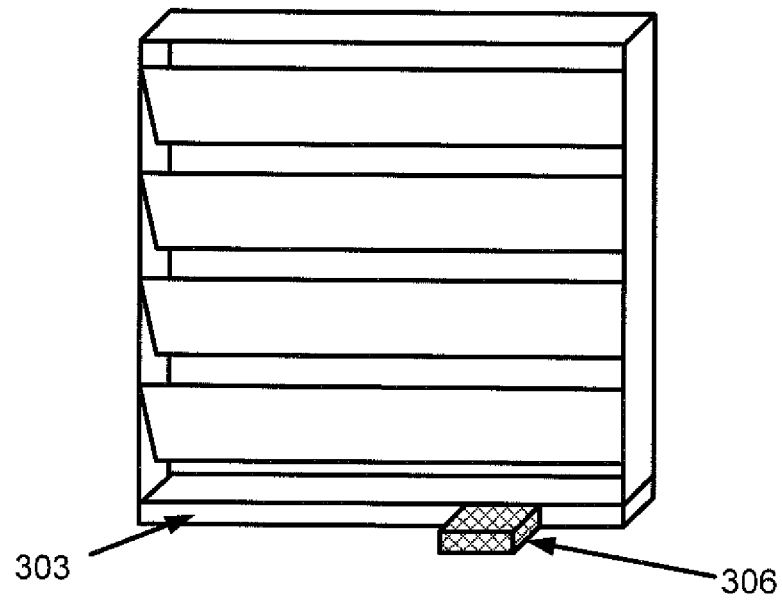
Figure 3C:
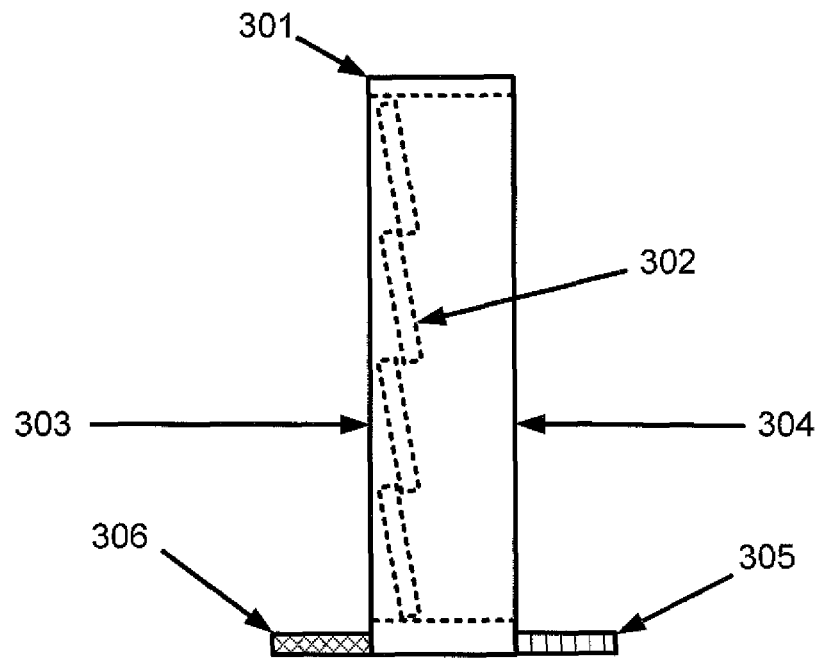
Figure 3D:
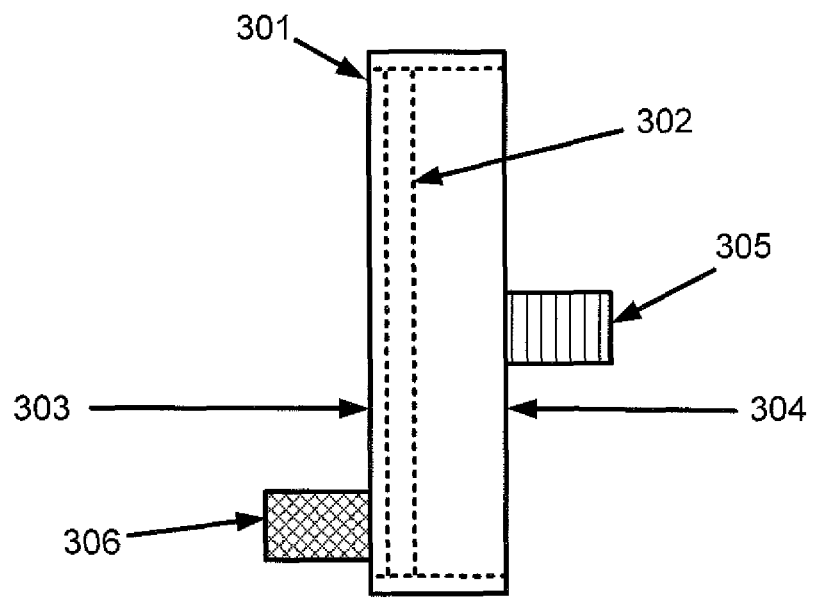

In accordance with one or more embodiments of the invention, FIG. 2(C) shows a side view of the second fan module (200) and FIG. 2(D) shows a top view of the second fan module (200). Features within the second fan module (200) are indicated by dashed lines. The direction of air flow, when the second fan (202) is active, is indicated by arrows with wavy tails. Specifically, air flows into the front side (205), through the second fan module (200), and out of the rear side (203).

In accordance with one or more embodiments of the invention, FIG. 3 shows a louver (300). Specifically, FIG. 3(A) shows a front view of the louver (300), FIG. 3(B) shows a rear view of the louver (300), FIG. 3(C) shows a side view of the louver (300), and FIG. 3(D) shows a top view of the louver (300). The louver (300) includes a housing (301). In one or more embodiments of the invention, the housing (301) is metal, plastic, or any other structural material. The louver (300) further includes a set of slats (302) disposed within the housing (301). The set of slats (302) operate as a one way air valve. When an air flow is directed from the rear side (303) of the housing (301) to the front side (304) of the housing (301), the set of slats (302) open. When an air flow is directed from the front side (304) to the rear side (303), the set of slats (302) close and prevent air flow.

In one or more embodiments of the invention, the louver (300) also includes a first key (306) disposed on the rear side (303), and a second key (305) disposed on the front side (304). In one or more embodiments, the first key (306) on the rear side (303) is the same shape and size as the second key (305) on the front side (304). In one or more embodiments of the invention, the relative location of the first key (306) on the rear side (303) and the relative location of the second key (305) on the front side (304) are different. For example, the first key (306) is farther up in FIG. 3(D) than the second key (305). The difference in relative location of the keys allows only the second key (306) to mate with the first key receptacle (106) and only the first key (305) to mate with the second key receptacle (206). In one or more embodiments of the invention, the first key (306) on the rear side (303) and is a different shape than the second key (305) on the front side (304). For example, the first key (306) may be square shaped and the second key (305) may be circular. The difference in shape of the keys allows only the second key (306) to mate with the first key receptacle (106) and only the first key (305) to mate with the second key receptacle (206). In one or more embodiments of the invention, the first key (306) on the rear side (303) and is a different size than the second key (305) on the front side (304). For example, the first key (306) may be 10 millimeters across and the second key (305) may be 5 millimeters across. The difference in size of the keys allows only the second key (306) to mate with the first key receptacle (106) and only the first key (305) to mate with the second key receptacle (206).

In one or more embodiments of the invention, the rear side (303) may include a first set of keys and the front side (303) may include a second set of keys. The quantity of keys of the first set of keys and the quantity of keys of the second set may be different. The difference in the quantity of keys allows only the second key set to mate with the first key receptacle (106) and only the first key set to mate with the second key receptacle (206).

In one or more embodiments of the invention, the rear side (303) of the housing (301) includes markings to indicate that it is the upstream side, e.g. air flow is only allowed into the rear side (303) of the housing (301). The front side (304) of the housing (301) includes markings to indicate that it is the downstream side, e.g. air flow is only allowed out of the front side (304) of the housing (301). For example, the rear side (303) may be substantially red in color and the front side (304) may be substantially blue in color. Other colors may be used without departing from the invention.

In accordance with one or more embodiments of the invention, FIG. 4 shows the operation of the louver (300) responding to a forward and reverse air flow. Specifically, FIG. 4(A) shows a side view of the louver (300) responding to a reverse air flow, FIG. 4(B) shows a top view of the louver (300) responding to a reverse air flow, FIG. 4(C) shows a side view of the louver (300) responding to a forward air flow, and FIG. 4(D) shows a top view of the louver (300) responding to a forward air flow. The air flow in FIGS. 4(A)-(D) is illustrated as arrows with wavy tails. As seen in FIGS. 4(A) and (B), when a reverse air flow is present the set of slats (302) closes and prevents air from flowing from the front side (304) of the louver (300) to the rear side (303) of the louver (300). As seen in FIGS. 4(C) and (D), when a forward air flow is present the set of slats (302) opens and allows air to flow from the front side (304) of the louver (300) to the rear side (303) of the louver.

Figure 5A:
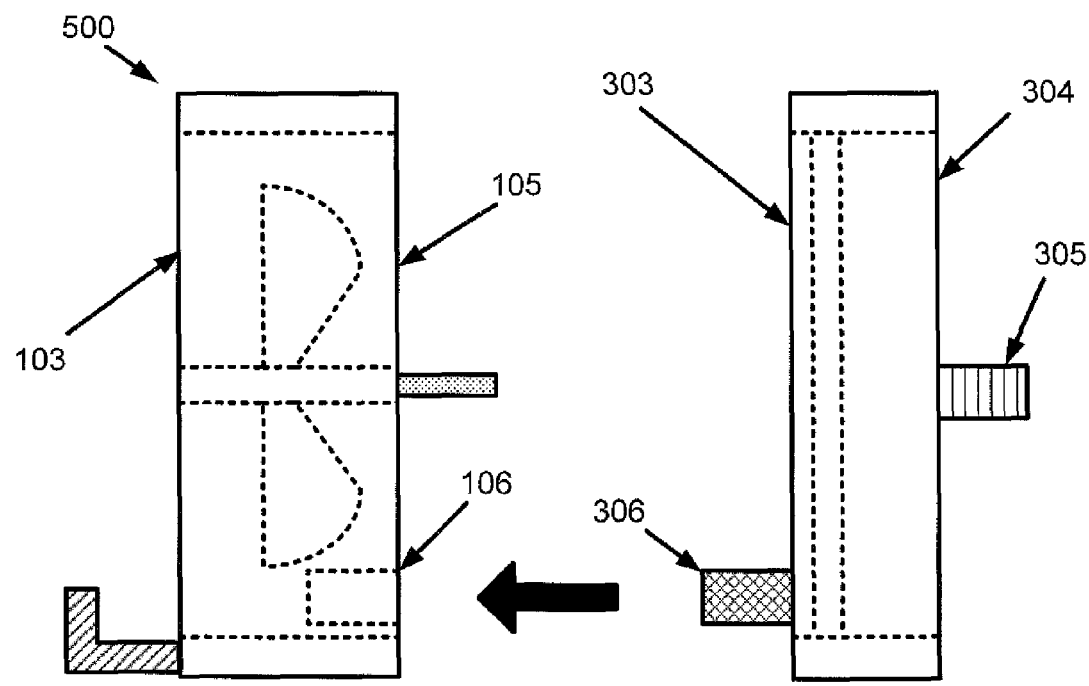
FIGS. 5(A)-(C) shows a fan module and a louver in accordance with one or more embodiments of the invention.
Figure 5B:
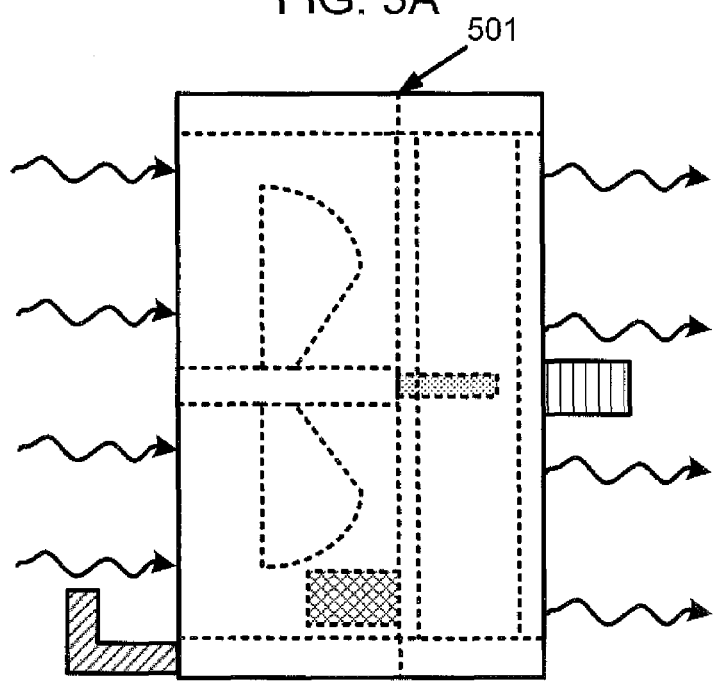
Figure 5C:
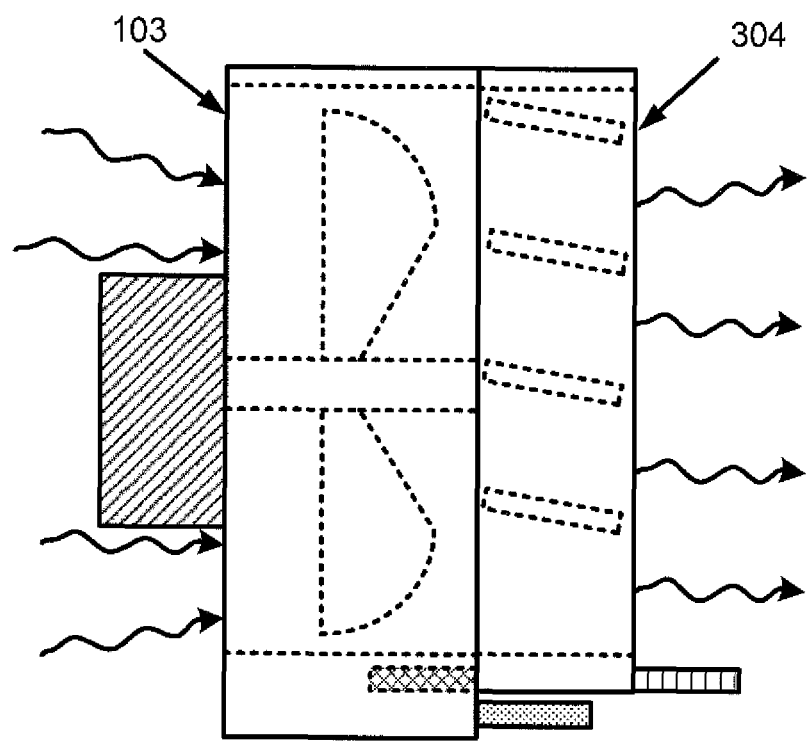

In accordance with one or more embodiments of the invention, FIG. 5 shows the process of mating (500) the second key (306) with the first key receptacle (106). Specifically, FIG. 5(A) shows a top view of the first fan module (100) and the louver (300) before mating, FIG. 5(B) shows a top view of the first fan module (100) and the louver (300) after mating, and FIG. 5(C) shows a side view of the first fan module (100) and the louver (300) after mating. As seen in FIGS. 5(B) and (C), once mated a first contact (501) is formed between the rear side (303) of the louver (300) and the front side (106) of the first fan module (100). The first contact (501) causes, when the first fan (102) is active, air to flow into the rear side (103) of the first fan module (100), through the first fan module (100), out of the front side (105) of the first fan module (100), into the rear side (303) of the louver (300), through the louver (300), and out of the front side (304) of the louver (300). The air flow is indicated by arrows with wavy tails. As seen from the air flow, when the second key (306) is mated with the first key receptacle (106), the first fan module (100) is upstream of the louver (300).

Figure 6A:
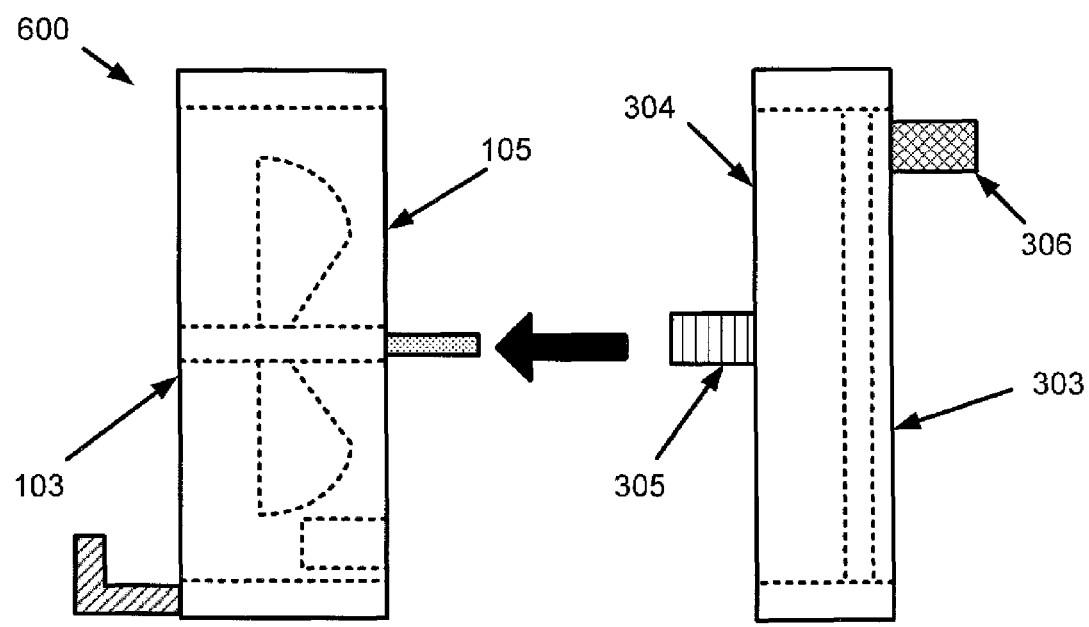
FIGS. 6(A)-(B) shows a fan module and a louver in accordance with one or more embodiments of the invention.
Figure 6B:
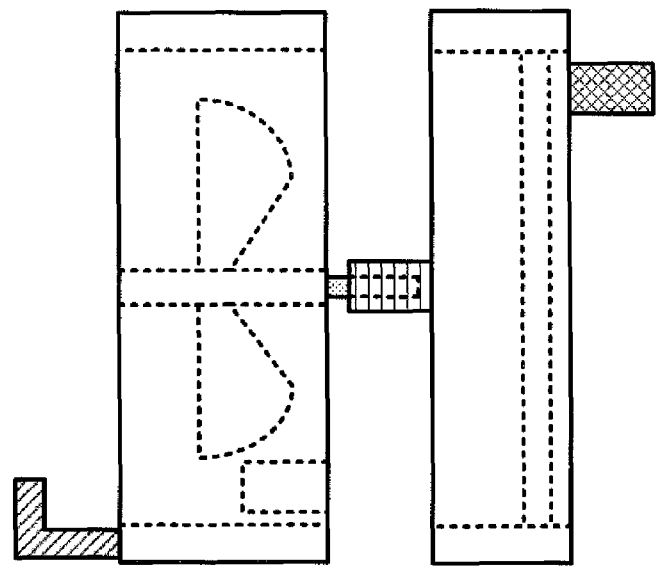

In accordance with one or more embodiments of the invention, FIG. 6 shows the process of attempting to mate (600) the first key (305) with the first key receptacle (106), e.g. the orientation of the louver (300) has been reversed from FIG. 5. Specifically, FIG. 6(A) shows a top view of the first fan module (100) and the louver (300) before attempting to mate and FIG. 6(B) shows a top view of the first fan module (100) and the louver (300) after attempting to mate. Mating the first fan module (100) to the louver (300) in the orientation shown in FIG. 6 would result in the first fan module (100) being downstream of the louver (300) which is not desirable. Activation of the first fan (102) would result in the louver closing and air flow being stopped. However, the mating attempt failed because the first key (305) cannot mate with the first key receptacle (106) due to the first key (305) being out of alignment with the first key receptacle (106). In one or more embodiments of the invention, the shape and/or size of the first key (305) may differ from the first key receptacle (106) to prevent mating.

Figure 7A:
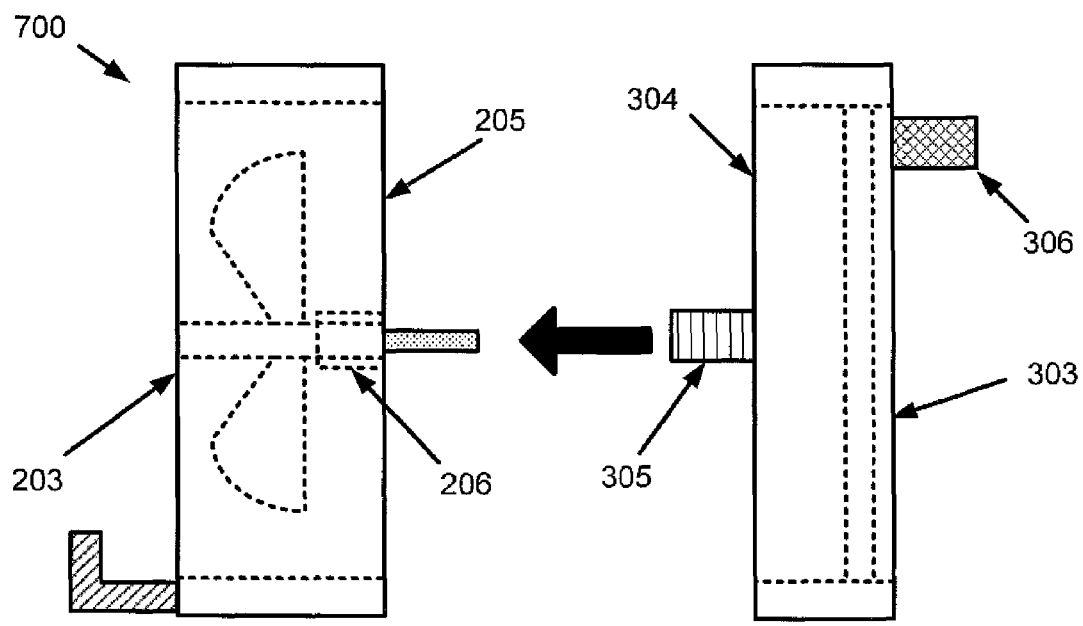
FIGS. 7(A)-(C) shows a fan module and a louver in accordance with one or more embodiments of the invention.
Figure 7B:
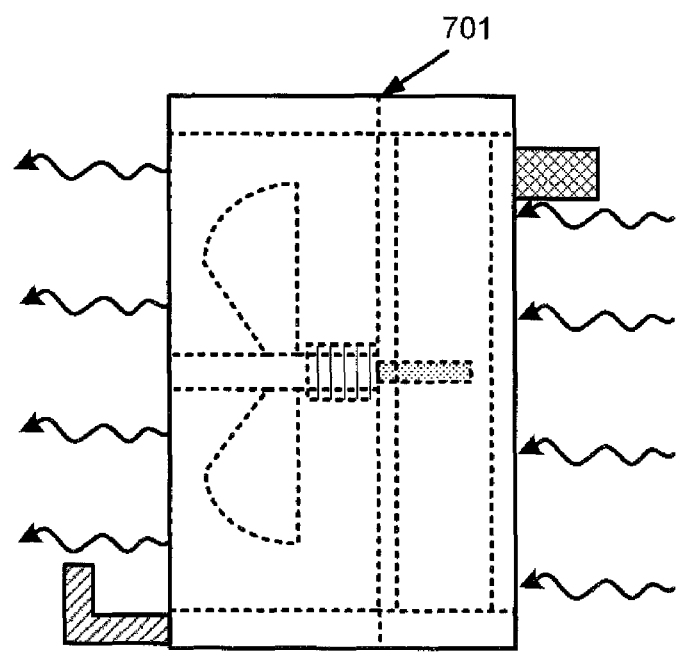
Figure 7C:
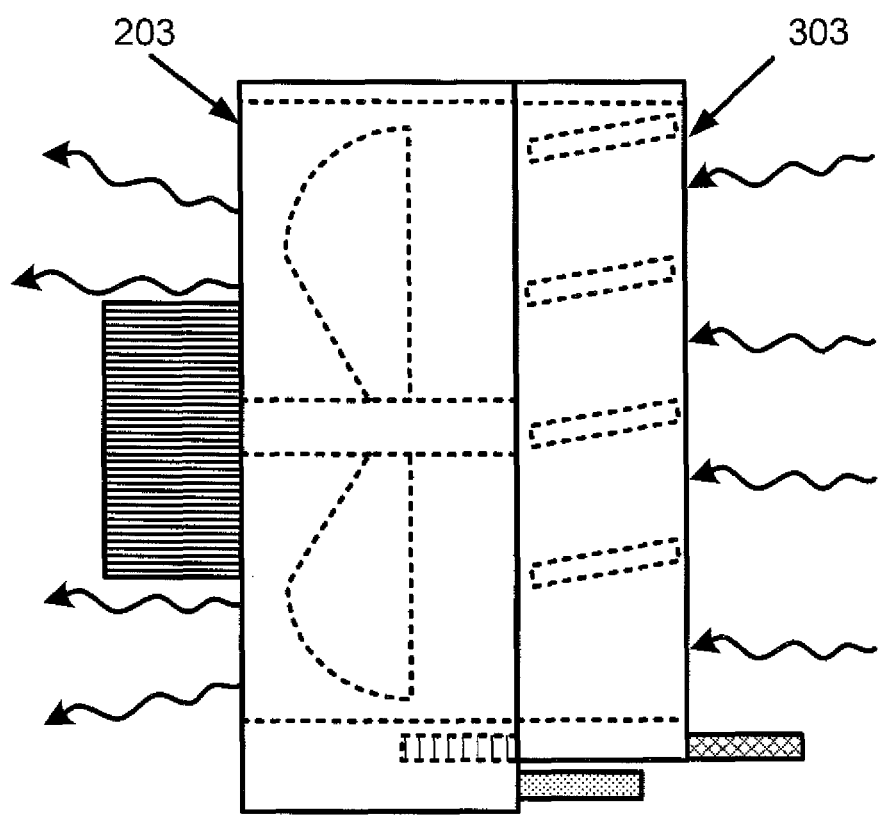

In accordance with one or more embodiments of the invention, FIG. 7 shows the process of mating (700) the first key (305) with the second key receptacle (206). Specifically, FIG. 7(A) shows a top view of the second fan module (200) and the louver (300) before mating, FIG. 7(B) shows a top view of the second fan module (200) and the louver (300) after mating, and FIG. 7(C) shows a side view of the second fan module (200) and the louver (300) after mating. As seen in FIGS. 7(B) and (C), once mated a second contact (701) is formed between the front side (304) of the louver (300) and the front side (205) of the second fan module (200). The second contact (701) causes, when the first fan (102) is active, air to flow into the rear side (303) of the louver (300), through the louver (300), out of the front side (304) of the louver (300), into the front side (205) of the second fan module (200), through the second fan module (200), and out of the rear of the second fan module (200). The air flow is indicated by arrows with wavy tails. As seen from the air flow, when the second key (306) is mated with the first key receptacle (206), the second fan module (200) is downstream of the louver (300).

Figure 8A:
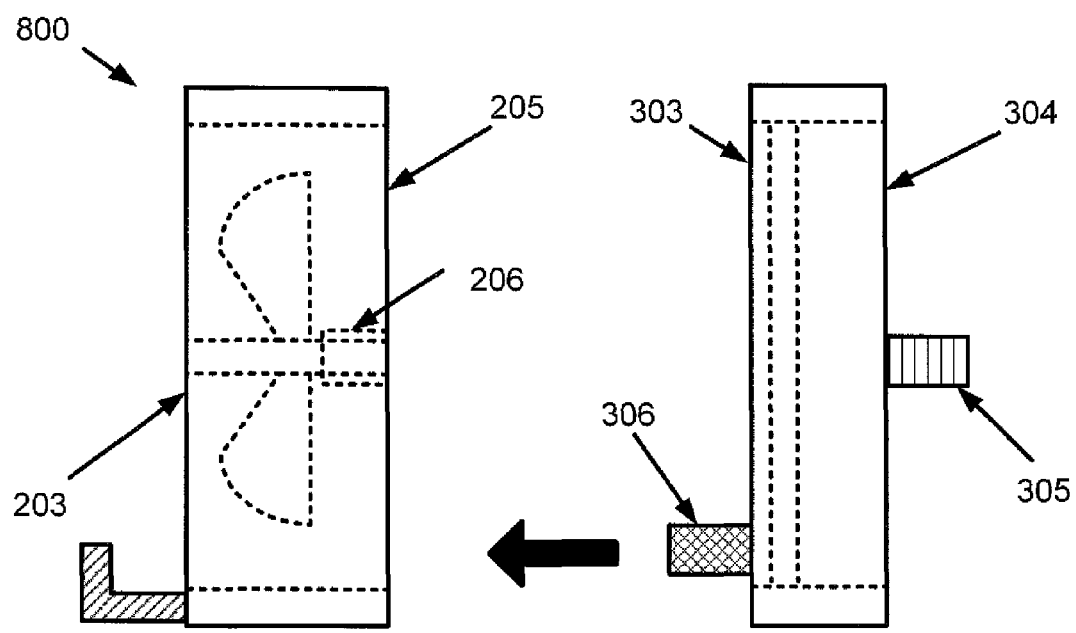
FIGS. 8(A)-(B) shows a fan module and a louver in accordance with one or more embodiments of the invention.
Figure 8B:
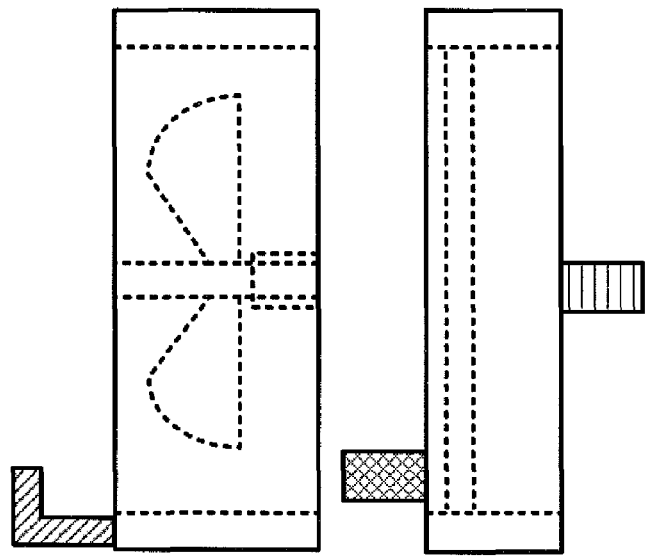

In accordance with one or more embodiments of the invention, FIG. 8 shows the process of attempting to mate (800) the second key (306) with the second key receptacle (206), e.g. the orientation of the louver (300) has been reversed from FIG. 7. Specifically, FIG. 8(A) shows a top view of the second fan module (200) and the louver (300) before attempting to mate and FIG. 8(B) shows a top view of the second fan module (200) and the louver (300) after attempting to mate. Mating the second fan module (200) to the louver (300) in the orientation shown in FIG. 8 would result in the second fan module (200) being upstream of the louver (300) which is not desirable. Activation of the second fan (202) would result in the louver closing and air flow being stopped. However, the mating attempt failed because the second key (306) cannot mate with the second key receptacle (206) due to the second key (306) being out of alignment with the second key receptacle (206). In one or more embodiments of the invention, the shape and/or size of the second key (306) may differ from the second key receptacle (206) to prevent mating.

Figure 9A:
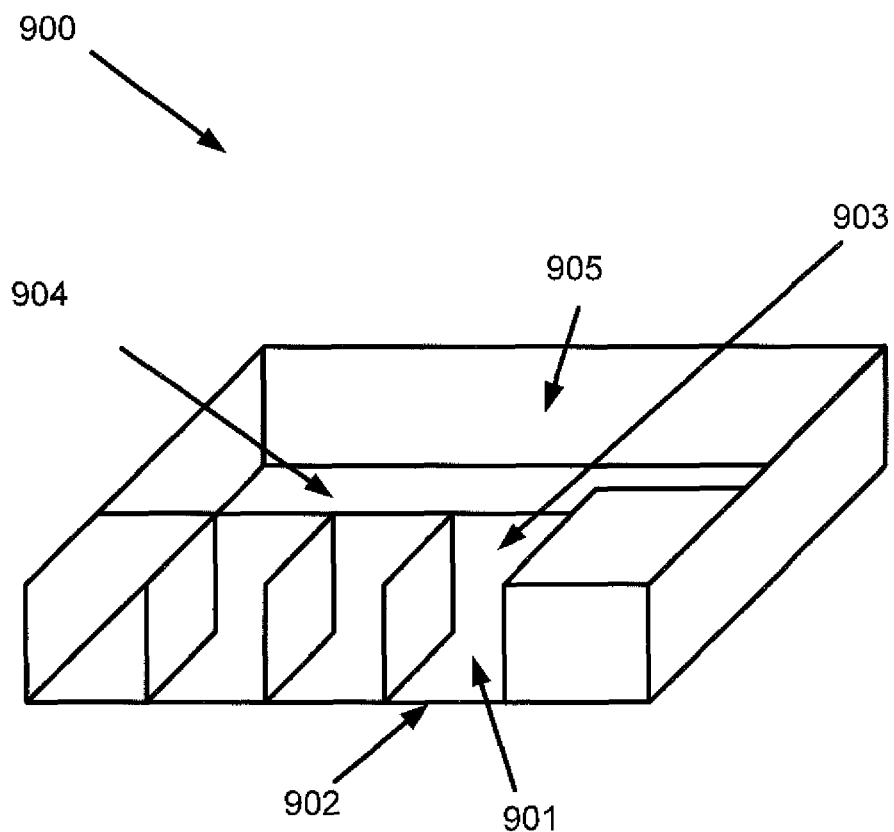
FIGS. 9(A)-(C) shows a chassis in accordance with one or more embodiments of the invention.
Figure 9B:
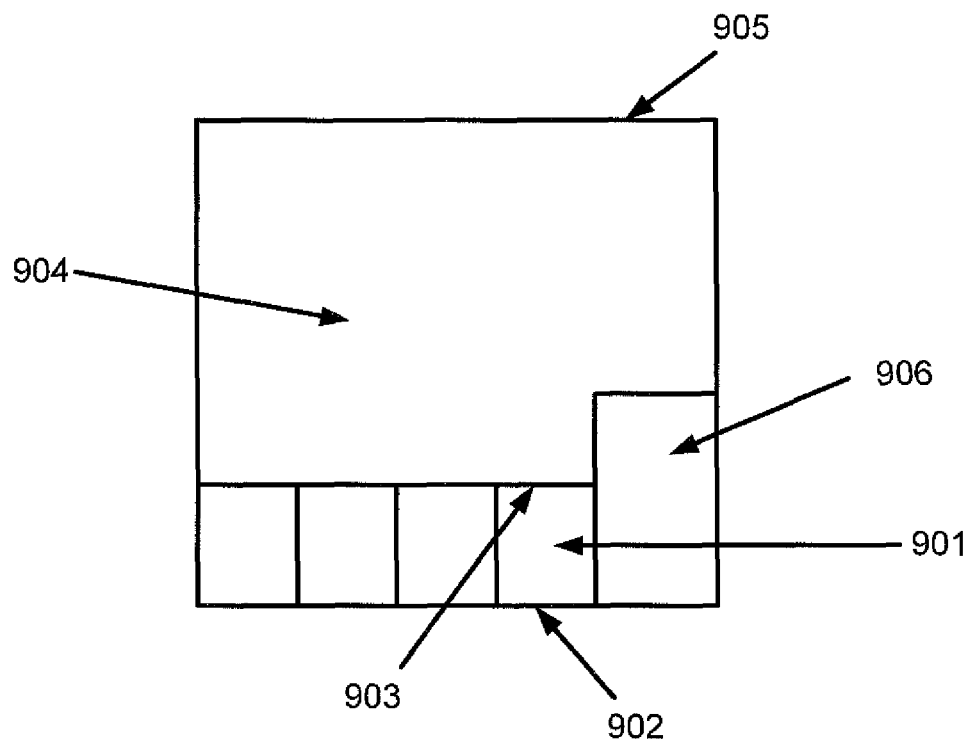
Figure 9C:
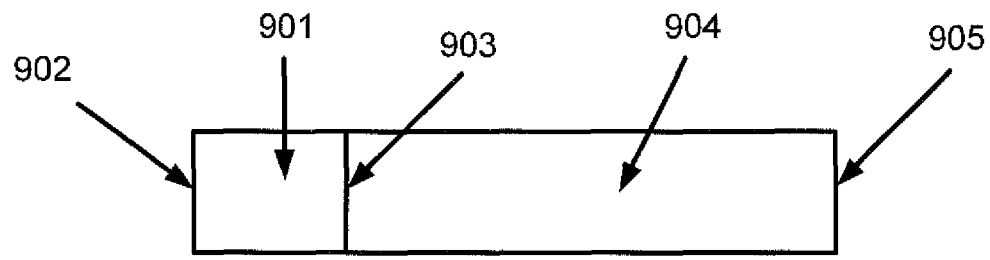

In accordance with one or more embodiments of the invention, FIG. 9 shows a chassis (900). In one or more embodiments, the chassis is a component of a network switch that houses electrical components that are part of the network switch. Specifically, FIG. 9(A) shows a rear view of the chassis (900), FIG. 9(B) shows a top view of the chassis (900), and FIG. 9(C) shows a side view of the chassis (900). The chassis (900) includes at least one bay (901), disposed on the rear of the chassis (900), that includes a louver (300) and a first fan module (100) or a second fan module (200). In one or more embodiments of the invention, the chassis (900) includes multiple bays that each include a louver (300) and either a first fan module (100) or a second fan module (200). In one or more embodiments of the invention, all of the fan modules included in the bays of the chassis (900) are a first type fan module (100). In one or more embodiments of the invention, all of the fan modules contained in the bays of the chassis (900) are a second type fan module (200). The bay (901) also includes a first opening (902) that opens to the outside of the chassis (900) and a second opening (903) that opens to the interior of the chassis (904). In one or more embodiments, the interior of the chassis (904) may include a circuit board, and/or other electronic components (not shown). The chassis (900) further includes a front side (905) that includes one or more openings that allows the passage of air. In one or more embodiments of the invention, the chassis (900) also includes a power supply (906) that powers the electronic components located within the interior of the chassis (904) as well as a first fan module (100) or second fan module (200) contained in the bay (902). The power supply (906) is omitted from FIG. 9(C) for clarity.

Figure 10A:
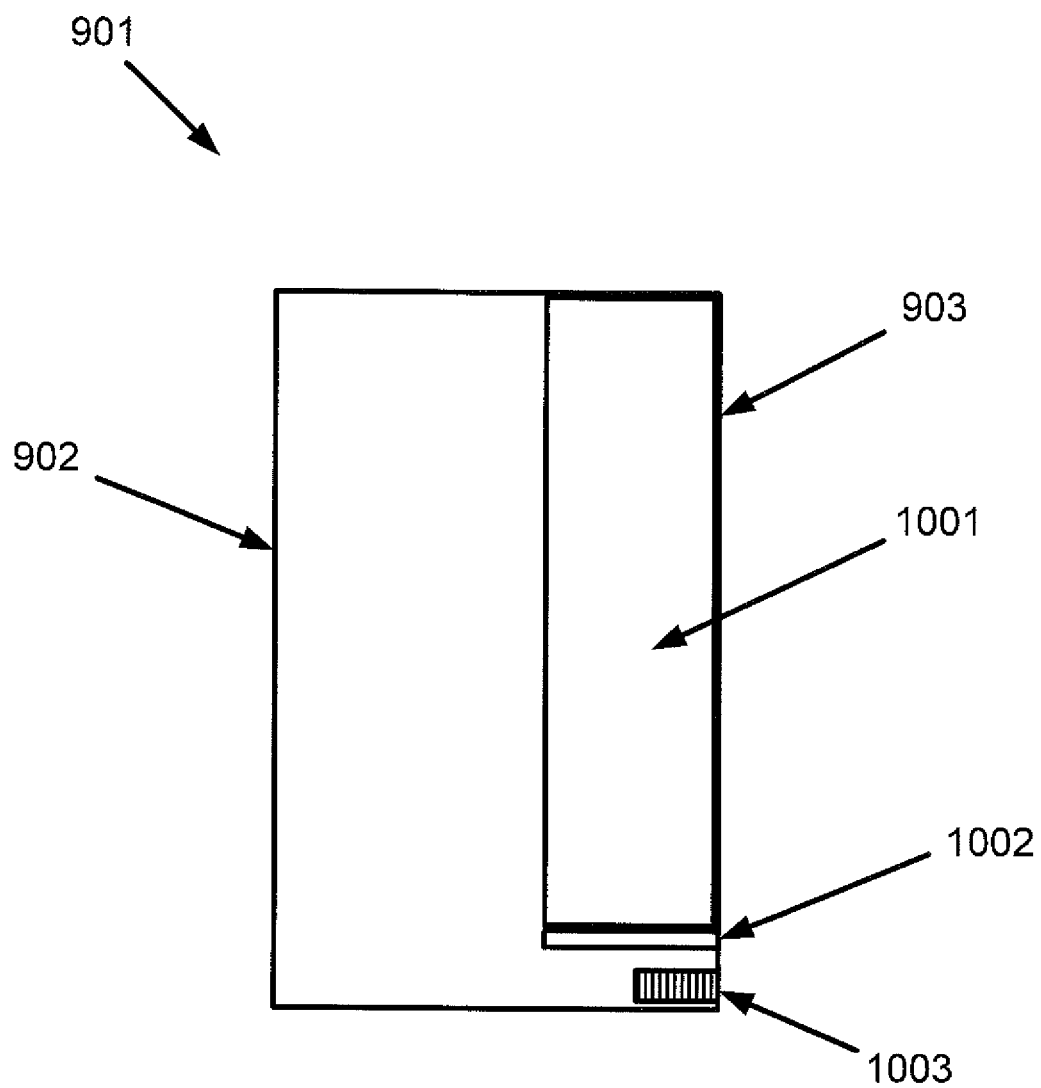
FIGS. 10(A)-(B) shows a bay in accordance with one or more embodiments of the invention.
Figure 10B:
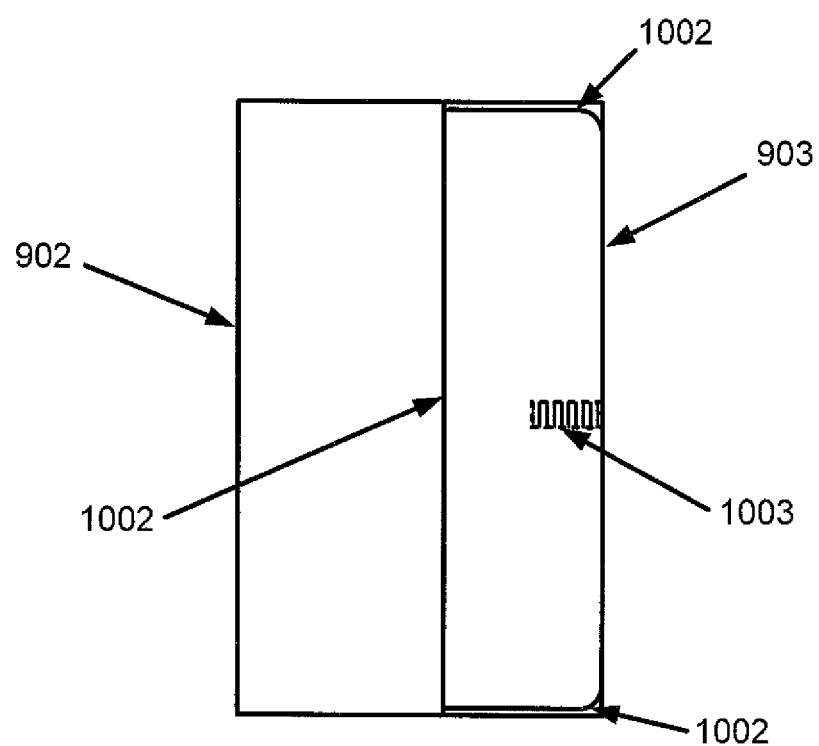

In accordance with one or more embodiments of the invention, FIG. 10 shows a bay (901). Specifically, FIG. 10(A) shows a side view of the bay (901) and FIG. 10(B) shows a top view of the bay (901). The bay (901) includes a pair of clips (1001), disposed on the wide walls of the bay (901) and adjacent to the second opening (903). The pair of clips (1001) engage the louver (300) when the louver (300) is inserted into the bay (901). When engaged by the pair of clips (1001), the louver (300) is held again the second opening (903) which aligns either the front side (304) or the rear side (303) of the louver (300) with the second opening (903).

In one or more embodiments of the invention, the bay (901) also includes a platform (1002). The platform (1002) is elevated from the floor of the bay (901) and holds the louver (300) off of the floor of the bay (901) when the louver (300) is in the bay (901). The platform (1002) is separated from the ceiling of the bay (901) by the height of the louver (300). In one or more embodiments of the invention, when the louver (300) is inserted in the bay (901), the louver (300) is held on four sides using the combination of the pair of clips (1001), the platform (1002), and the ceiling of the bay (901).

In one or more embodiments of the invention, the bay (901) also includes a second power connector (1003), disposed below the platform. The second power connector (1003) engages with the power plug (107) on the first fan module (100) when the second key (306) is mated with the first key receptacle (106) or with the power plug (207) on the second fan module (200) when the first key (305) on the louver (300) is mated with the second key receptacle (206).

Figure 11A:
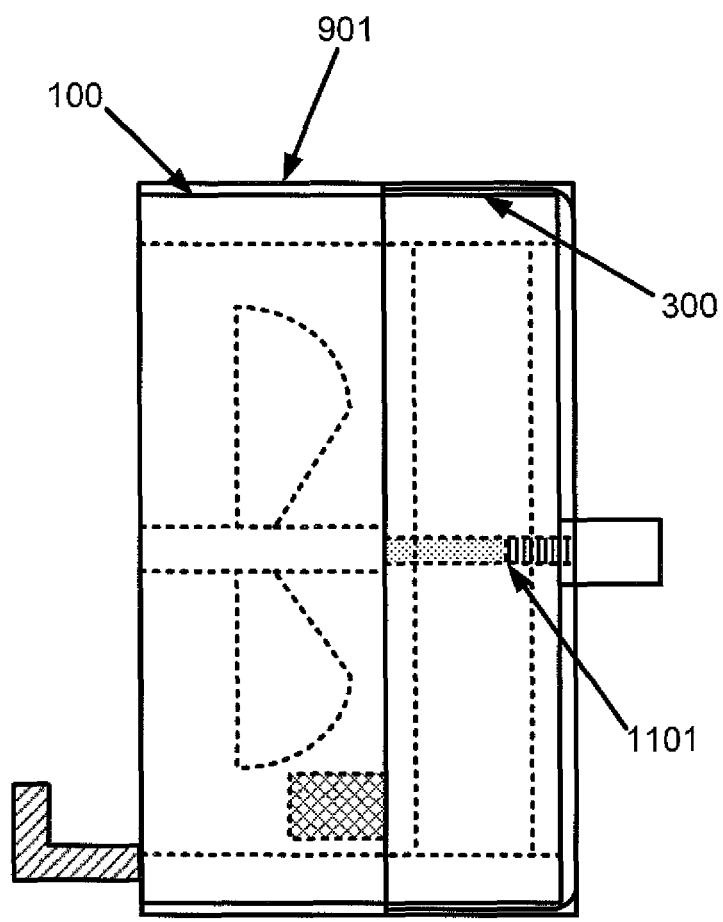
FIGS. 11(A)-(B) shows a bay, fan module, and louver in accordance with one or more embodiments of the invention.
Figure 11B:
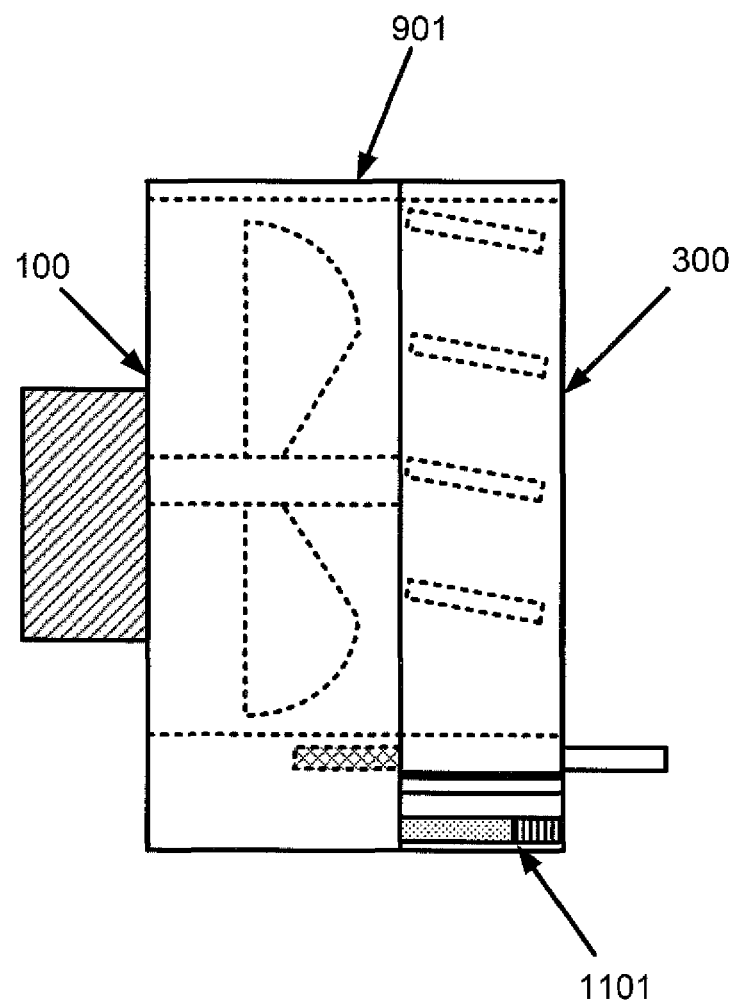

In accordance with one or more embodiments of the invention, FIG. 11 shows a first fan module (100) and a louver (300) in a bay (901). Specifically, FIG. 11(A) shows a top view of the first fan module (100) and the louver (300) in the bay (901) and FIG. 11(B) shows a side view of the first fan module (100) and the louver (300) in the bay (901). When the first fan module (100) is mated to the louver (300) and in the bay (901), the power connector (107) mates with the second power connector (1003) and forms a power supply connection (1101) that supplies power to the first fan module (100). However, if the first fan module (100) is not mated with the louver (300), the first key (305) or second key (306) prevents the power connector (107) from mating with the second power connector (1003). For example, if the first fan module (100) and louver (300) were oriented as shown in FIG. 6(A), the first key (305) would prevent the power connector (107) from mating with the second power connector (1003). Similarly, if the second fan module (200) is not mated to the louver (300) when in the bay (901), the second key (306) prevents the power connector (207) from mating with the second power connector (1003).

Figure 12A:
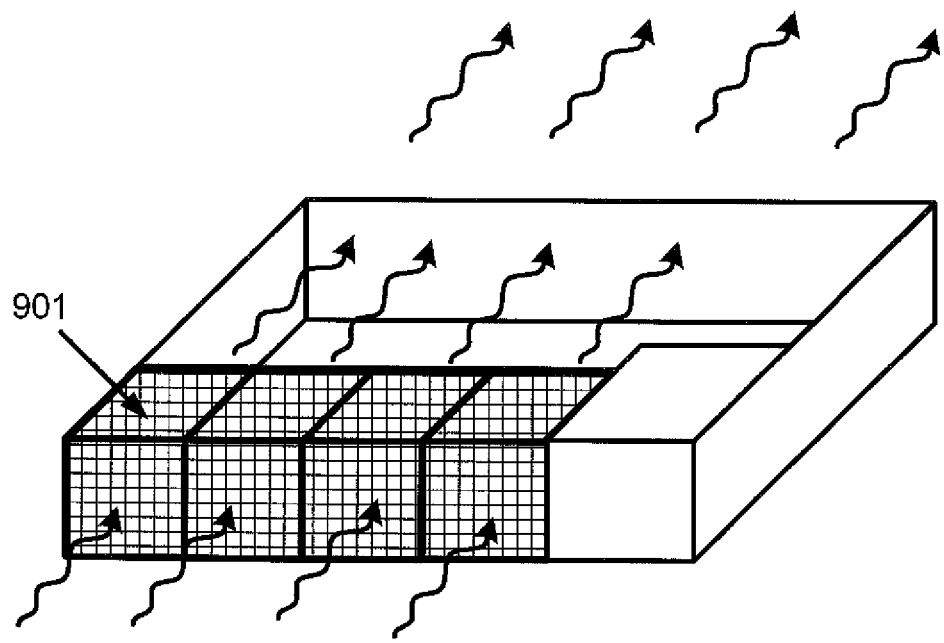
FIGS. 12(A)-(B) shows a chassis, bay, fan module, and louver in accordance with one or more embodiments of the invention.

In accordance with one or more embodiments of the invention, FIG. 12 shows the air flow in the chassis (900). Specifically, FIG. 12(A) shows a rear view of the air flow when the bays (901) in the chassis (900) include a first fan module (100) mated to a louver (300). Air flow is indicated by arrows with wavy tails. When the first fan module (100) is active, air flows into the first opening (902), through the bay (901), out of the second opening (903), through the interior of the chassis (904), and out of one or more openings in the front side (905) of the chassis (900).

Figure 12B:
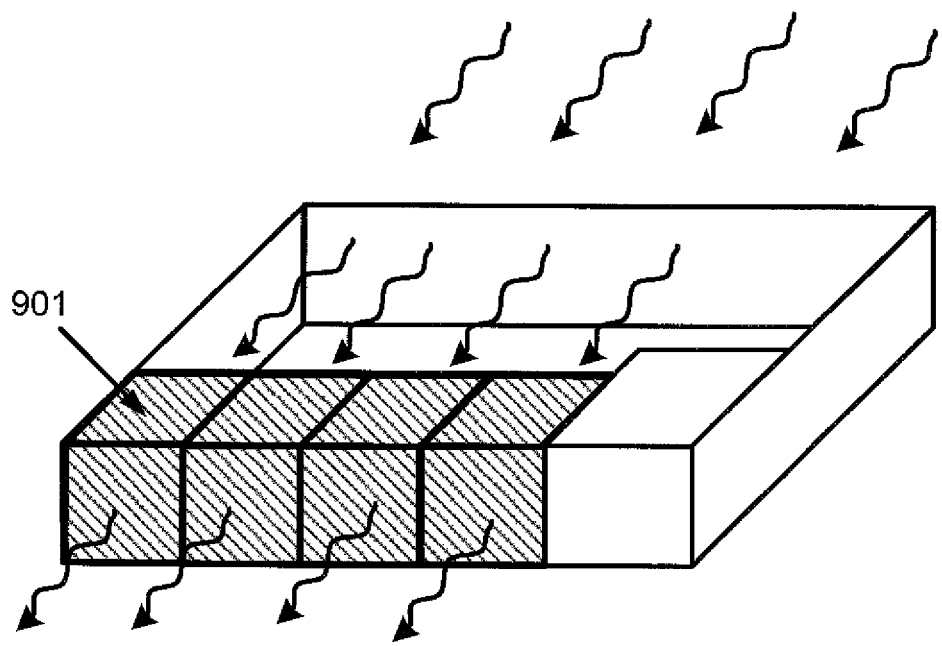

FIG. 12(B) shows a rear view of the air flow when the bays (901) in the chassis (900) include a second fan module (200) mated to a louver (300). When the second fan module (200) is active, air flows into one or more openings in the front side (905) of the chassis (900), through the interior of the chassis (904), into the second opening (902), through the bay (901), and out of the first opening (902).

Figure 13:
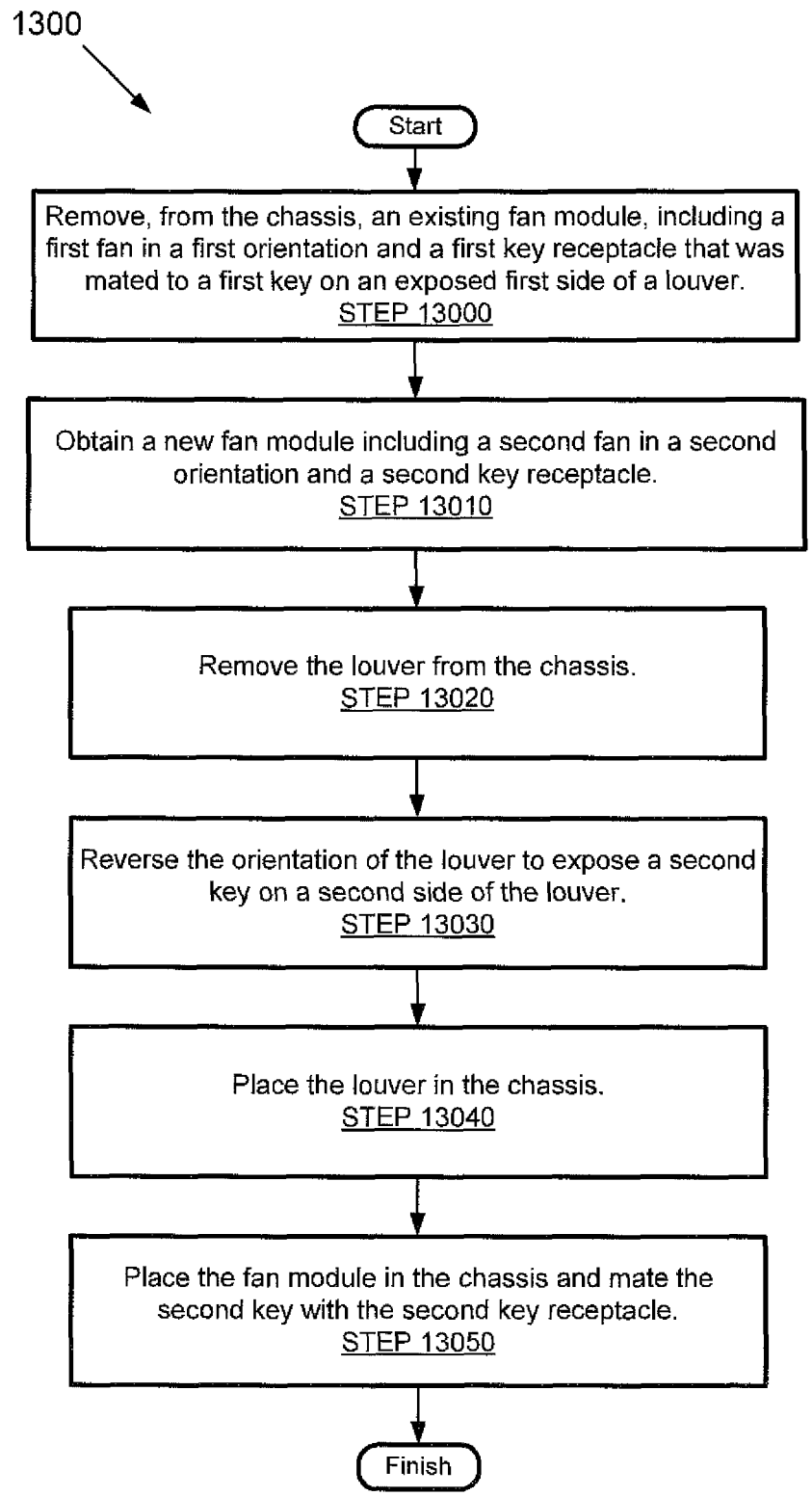
FIG. 13 shows a method in accordance with one or more embodiments of the invention.

FIG. 13 shows a flowchart (1300) in accordance with one or more embodiments of the invention. The method depicted in FIG. 13 may be used to change the direction of air flow within a chassis. One or more steps shown in FIG. 13 may be omitted, repeated, and/or performed in a different order among different embodiments.

At Step 13000, an existing fan module is removed from the chassis. The fan module includes a first fan in a first orientation and a first key receptacle. Before removal, the first key receptacle was mated to a first key on an exposed first side of a louver within the chassis. At Step 13010, a new fan module is obtained that includes a second fan in a second orientation and a second key receptacle. For example, obtaining a new fan module may include ordering the new fan module from a supplier. At Step 13020, the louver is removed from the chassis. At Step 13030, the orientation of the louver is reversed to expose a second key on a second side of the louver. At Step 13040, the louver is placed in the chassis. At Step 13050, the new fan module is placed in the chassis and the second key receptacle is mated with the second key.

Embodiments of the invention enable air flow within a chassis to be reliably reversed without removing the chassis from, e.g. a rack in a data center. Further embodiments of the invention readily allow fan modules to be easily identified as either an upstream or downstream fan module. Additional embodiments of the invention readily allow the upstream side and the downstream side of louvers to be identified. Additional embodiments may prevent upstream fan modules from being used on the downstream side of louvers and downstream fan modules from being used on the upstream side of louvers by a set of keys and key receptacles.

While the invention has been described with respect to a limited number of embodiments, those skilled in the art, having the benefit of this disclosure, will appreciate that other embodiments can be devised which do not depart from the scope as disclosed herein. Accordingly, the scope should be limited by the attached claims.

What is claimed is:

1. A system, comprising:
 a fan module comprising:
  a first housing adapted to include a fan in a first orientation, wherein the first housing has a front side and a rear side on opposite sides of the first housing;
  the fan, disposed within the first housing, is adapted to:
   cause air to flow into the rear side of the first housing, through the first housing, and out of the front side of the first housing when in the first orientation;
  a key receptacle, disposed on the front side of the first housing, adapted to:
   mate with a first key, when the fan is in the first orientation;
 a louver comprising:
  a second housing comprising a set of slats, wherein the second housing has a front side and a rear side on opposite sides of the second housing;
  the set of slats, disposed within the second housing, wherein the set of slats is adapted as:
   a one way valve that allows air to flow into the rear side of the second housing, through the second housing, and out of the front side of the second housing;
  the first key, disposed on the rear side of the second housing, is adapted to only mate with the key receptacle;
  a second key, disposed on the front side of the second housing, is adapted to not mate with the key receptacle;
 wherein coupling of the key receptacle with the first key comprises an approaching of the first housing towards, and in a direction perpendicular to, the rear side of the second housing;
 wherein decoupling of the key receptacle with the first key comprises a distancing of the first housing from, and in the direction perpendicular to, the rear side of the second housing;
 wherein after the first key is mated with the key receptacle, a first contact is formed between the front side of the first housing and rear side of the second housing and the first contact causes, when the fan is active, an air flow into the rear side of the first housing, through the first housing, out of the front side of the first housing, into the rear side of the second housing, through the second housing, and out of the front side of the second housing.

2. The system of claim 1, wherein the fan module further comprises:
 a first portion on the rear side of the first housing adapted as a handle, wherein the first portion is further adapted to identify if the fan is in the first orientation or in a second orientation.

3. The system of claim 1, wherein the fan module further comprises:
 a first power connector disposed on the front side of the first housing.

4. The system of claim 3, wherein the system further comprises:

a chassis comprising:
- a front side of the chassis and a rear side of the chassis on opposite sides of the chassis;
- a bay, within the chassis, comprising:
  - a first opening, disposed on the rear side of the chassis, that opens to an outside of the chassis;
  - a second opening that opens to an inside of the chassis;
  - a central volume adapted to engage the louver and the fan module;
  - a second power connector adapted to mate to the first power connector; and
  - a plurality of holes disposed on the front side of the chassis.

5. The system of claim 4, wherein when the rear side of the second housing is mated to the fan module and the louver is engaged by the central volume, activation of the fan causes an air flow into the first opening, through the fan module, through the louver, through an interior portion of the chassis, and out of at least one of the plurality of holes on the front side of the chassis.

6. The system of claim 4, wherein the first power connector is only able to mate with the second power connector when the first key mates with the key receptacle, when the fan is in the first orientation.

7. The system of claim 4, wherein the central volume further comprises a set of clips that position the second housing on the second opening when the central volume engages the louver.

8. The system of claim 7, wherein the central volume further comprises a shelf disposed above the second power connector and below the set of clips, adapted to support the second housing.

9. The system of claim 4, wherein the chassis is a component of a network switch that houses electrical components that are a part of the network switch.

10. The system of claim 4, where the chassis further comprises a plurality of additional bays, wherein each additional bay comprises an additional fan module comprising an additional fan and an additional louver.

11. The system of claim 10, wherein the fan module and the additional fan modules permit air flows in a same direction.

* * * * *